United States Patent [19]
Lowrey et al.

[11] Patent Number: 6,075,719
[45] Date of Patent: Jun. 13, 2000

[54] METHOD OF PROGRAMMING PHASE-CHANGE MEMORY ELEMENT

[75] Inventors: Tyler Lowrey; Guy C. Wicker; Boil Pashmakov; Patrick J. Klersy; Sergey A. Kostylev; Wolodymyr Czubatyj, all of Troy, Mich.

[73] Assignee: Energy Conversion Devices, Inc., Troy, Mich.

[21] Appl. No.: 09/337,778

[22] Filed: Jun. 22, 1999

[51] Int. Cl.$^7$ ...................................................... G11C 11/00
[52] U.S. Cl. ........................................... 365/148; 365/151
[58] Field of Search ................................... 365/148, 151, 365/163, 100

[56] References Cited

U.S. PATENT DOCUMENTS 5,933,365  8/1999  Klersy et al. ........................... 365/148

*Primary Examiner*—David Nelms
*Assistant Examiner*—David Lam
*Attorney, Agent, or Firm*—Philip H. Schlazer; Marvin S. Siskind; David W. Schumaker

[57] ABSTRACT

A method of programming an electrically programmable phase-change memory element to the low resistance state. A first pulse of energy sufficient to transform the device from the low to high resistance states is applied, and a second pulse of energy sufficient to transform the device from the high to low resistance states is applied following the first pulse. In another programming method, the present and desired device states are compared, and programming pulses are applied only if the state of the device needs to be changed.

18 Claims, No Drawings

METHOD OF PROGRAMMING PHASE-CHANGE MEMORY ELEMENT

FIELD OF THE INVENTION

The present invention relates generally to phase-change electrical memory. More specifically, the present invention relates to methods of programming phase-change memory elements.

BACKGROUND OF THE INVENTION

The Ovonic EEPROM is a proprietary, high performance, non-volatile, thin-film electronic memory device. Its advantages include non-volatile storage of data, potential for high bit density and, consequently, low cost because of its small footprint and simple two-terminal device configuration, long reprogramming cycle life, low programming energies and high speed. The Ovonic EEPROM is capable of both analog and digital forms of information storage. Digital storage can be either binary (one bit per memory cell) or multi-state (multiple bits per cell).

The use of electrically writable and erasable phase-change materials (i.e., materials which can be electrically switched between generally amorphous and generally crystalline states or between different resistive states while in crystalline form) for electronic memory applications is well known in the art and is disclosed, for example, in commonly assigned U.S. Pat. No. 5,166,758, the disclosure of which is incorporated by reference herein. Other examples of electrical phase-change materials and memory elements are provided in commonly assigned U.S. Pat. Nos. 5,296,716, 5,414,271, 5,359,205, 5,341,328, 5,536,947, 5,534,712, 5,687,112, and 5,825,046 the disclosures of which are all incorporated by reference herein. Still another example of a phase-change memory element is provided in commonly assigned U.S. patent application Ser. No. 09/276,273, the disclosure of which is incorporated herein by reference.

Generally, the phase-change materials are capable of being switched between a first structural state where the material is generally amorphous and a second structural state where the material is generally crystalline local order. The term "amorphous", as used herein, refers to a condition which is relatively structurally less ordered or more disordered than a single crystal and has a detectable characteristic, such as high electrical resistivity. The term "crystalline", as used herein, refers to a condition which is relatively structurally more ordered than amorphous and has lower electrical resistivity than the amorphous state.

The phase-change materials may also be electrically switched between different detectable states of local order across the entire spectrum between completely amorphous and completely crystalline states. That is, switching of such materials is not required to take place between completely amorphous and completely crystalline states but rather the material can be switched in incremental steps reflecting (1) changes of local order, or (2) changes in volume of two or more materials having different local order so as to provide a "gray scale" represented by a multiplicity of conditions of local order spanning the spectrum between the completely amorphous and the completely crystalline states.

The phase-change material exhibits different electrical characteristics depending upon its. state. For instance, in its crystalline, more ordered state the material exhibits a lower electrical resistivity than in its amorphous, less ordered state. The volume of phase-change material is capable of being switched between a more ordered, low resistance state and a less ordered, high resistance state. The low resistance state has a resistance value which is less than the resistance value of the high resistance state. Furthermore, the resistance values of the high and low resistance states are detectably distinct.

The volume of phase-change memory material is capable of being transformed from its high resistance state to its low resistance state when a relatively long pulse of energy, referred to as a "set pulse", is applied to the material. While not wishing to be bound by theory, it is believed that application of a set pulse to the volume of memory material changes the local order of at least a portion of the volume of material. Specifically, the applied energy causes at least a portion of the volume of memory material to change from its less-ordered "amorphous" condition to a more-ordered "crystalline" condition by causing some amount of crystallization (i.e., nucleation and/or growth).

Application of additional consecutive set pulses promotes further crystallization of the memory material. As consecutive set pulses are applied, new nucleation sites are formed and existing crystallites increase in size. Increased crystallite size creates stress at the boundaries between the memory material and other layers of the memory element (for example, between the memory material and the contact layer material), thereby increasing the tendency for delamination of the memory element.

There is thus a need for a method of programming the memory element which ensures that consecutive set pulses are not applied to the volume of memory material.

SUMMARY OF THE INVENTION

An objective of the present invention is to provide a method of programming a phase-change memory element which ensures that consecutive set pulses are not applied to the volume of memory material. Another objective of the present invention is to increase the cycle life of the phase-change memory element.

This and other objectives are satisfied by a method of programming an electrically programmable, phase-change memory element to a low resistance state, the memory element including a volume of phase-change memory material having at least the low resistance state and a detectably distinct high resistance state, the method comprising the steps of: applying a first pulse of energy to the memory material, the first pulse sufficient to transform the memory material from the low resistance state to the high resistance state; and applying a second pulse of energy to the memory material following the first pulse, the second pulse sufficient to transform the memory material from the high resistance state to the low resistance state.

These and other objectives are also satisfied by a method of setting an electrically programmable, phase-change memory element having at least a low resistance state and a detectably distinct high resistance state, the method comprising the steps of: applying a first pulse of energy to the memory material, the first pulse sufficient to transform the memory material from the low resistance state to the high resistance state; and applying a second pulse of energy to the memory material following the first pulse, the second pulse sufficient to transform the memory material from the high resistance state to the low resistance state.

These and other objectives are also satisfied by a method of programming an electrically programmable, phase-change memory element to a desired state, the memory element including a volume of phase-change memory material having at least a low resistance state and a detectably distinct high resistance state, the method comprising the steps of: reading the present state of the memory element; determining whether the present state is equal to the desired state; and if not, programming the memory element from the present state to the desired state.

DETAILED DESCRIPTION OF THE INVENTION

Disclosed herein are novel methods of programming a phase-change memory element. The memory element comprises a volume of phase-change memory material having at least a high resistance state and a low resistance state. The high resistance state is characterized by a high electrical resistance value, and the low resistance state is characterized by a low electrical resistance value. The high electrical resistance value is greater than the low electrical resistance value. The high electrical resistance value is detectably distinct from the low electrical resistance value. The high resistance state is the less ordered state wherein the volume of memory material has increased amorphicity. The low resistance state is the more ordered state wherein the volume of memory material has increased crystallinity. As used herein a memory element is in its high resistance state when its corresponding volume of memory material is in the high resistance state (i.e., is less ordered and has the high resistance value). Likewise a memory element is in its low resistance state when its corresponding volume of memory material is in the low resistance state (i.e., is more ordered and has the low resistance value).

As discussed above, the volume of memory material is capable of being transformed from the high resistance state to the low resistance state in response to the input of a single pulse of energy which is referred to herein as a "set pulse". The set pulse is sufficient to transform the volume of memory material from the high resistance state to the low resistance state. The act of transforming the volume of memory material from the high resistance state to the low resistance state is referred to herein as "setting" the memory element. It is believed that application of a set pulse to the volume of memory material changes the local order of at least a portion of the volume of memory material. Specifically, it is believed that the set pulse is sufficient to change at least a portion of the volume of memory material from a less-ordered amorphous state to a more-ordered crystalline state.

The volume of memory material is also capable of being transformed from the low resistance state to the high resistance state in response to the input of a single pulse of energy which is referred to herein as a "reset pulse". The reset pulse is sufficient to transform the volume of memory material from the low resistance state to the high resistance state. The act of transforming the volume of memory material from the low resistance state to the high resistance state is referred to herein as "resetting" the memory element. While not wishing to be bound by theory, it is believed that application of a reset pulse to the volume of memory material changes the local order of at least a portion of the volume of memory material. Specifically, it is believed that the reset pulse is sufficient to change at least a portion of the volume of memory material from a more-ordered crystalline state to a less-ordered amorphous state.

Disclosed herein is a novel method of programming the memory element to the low resistance state from any other resistance state. The memory element may be programmed to the low resistance state from the high resistance state. Alternately, a memory element may be programmed to the low resistance state from the low resistance state (i.e., a memory element which is already in the low resistance state may be programmed so that it remains in the low resistance state). This may occur when data designed to program the memory element to the low resistance state is written to a memory element which is already in the low resistance state (for example, logic 0 data may be written to a memory element which is already in the logic 0 state, or logic 1 data may be written to a memory element which is already in the logic 1 state). Table 1 shows the two possible "present state" to "next state" transitions which are possible for programming a memory element (having a high resistance state and a low resistance state) to the low resistance state.

TABLE 1

| PRESENT STATE | NEXT STATE |
| --- | --- |
| high resistance | low resistance |
| low resistance | low resistance |

The memory element may be programmed from its high resistance state to its low resistance state by applying two pulses of energy to the memory material. The two pulses of energy comprise a first pulse of energy followed by a second pulse of energy. The first pulse of energy is sufficient to transform the volume of memory material from its low resistance state to its high resistance state. Specifically, the first pulse is characterized by an amplitude, duration, rise time and fall time which are sufficient to transform the volume of memory material from its low resistance state to its high resistance state. The energy applied by the first pulse is sufficient to transform at least a portion of the volume of memory material from the more-ordered crystalline condition to the less-ordered amorphous condition. The first pulse of energy is a reset pulse as described above.

The second pulse of energy is applied to the memory material following the first pulse. The second pulse is sufficient to transform the volume of memory material from its high resistance state to its low resistance state. Specifically, the second pulse is characterized by an amplitude, duration, rise time and fall time which are sufficient to transform the volume of memory material from its high resistance state to its low resistance state. The energy supplied by the second pulse is sufficient to transform at least a portion of the volume of memory material form the less-ordered "amorphous" condition to the more-ordered "crystalline" condition. The second pulse of energy is a set pulse as described above. Hence, the memory element may be programmed from its high resistance state to its low resistance state by applying a reset pulse followed by a set pulse.

Preferably, the amplitude of the first pulse (the reset pulse) is greater than the amplitude of the second pulse (the set pulse) Also, preferably, the duration of the first pulse is less than the duration of the second pulse. The actual amplitudes, durations, rise times and fall times selected for the first and second pulses depend upon certain factors including, but not limited to, the size of the volume of memory material, the memory material used, the type of energy used, and the means of applying said energy to the memory material, etc.

As described above, a memory element which is already in the low resistance state may be programmed so that it remains in the low resistance state. The memory element may be programmed to the low resistance state from a previous low resistance state by applying to the volume of memory material a reset pulse followed by a set pulse.

In summary, according to the method of programming of the present invention, the phase-change memory element may be programmed from the high resistance state to the low resistance state by application of a reset pulse followed by a set pulse. The memory element may also be programmed from the low resistance state to the low resistance state by application of a reset pulse followed by a set pulse.

The programming method disclosed above, describes a method of programming a memory element to the low resistance state. The memory element may, of course, be programmed to the high resistance state from either a previous low resistance state or from a previous high resistance state. The state transitions to the high resistance state are shown in Table 2.

TABLE 2

| PRESENT STATE | NEXT STATE |
|---|---|
| low resistance | high resistance |
| high resistance | high resistance |

The memory element may be programmed to the high resistance state from any other state by applying a single reset pulse to the memory material. In particular, either of the state transitions shown in Table 3 may be accomplished by applying a single reset pulse to the memory material. Hence, the memory element may be programmed from the low resistance state to the high resistance state, or from the high resistance state to the high resistance state by applying a reset pulse to the memory material.

The possible state transitions of the memory element and the pulse sequences which may be used to program the memory element from one state to the other for all four possible state transitions is summarized in Table 3.

TABLE 3

| PRESENT STATE | NEXT STATE | PULSE SEQUENCE |
|---|---|---|
| high resistance | low resistance | reset followed by set |
| low resistance | low resistance | reset followed by set |
| low resistance | high resistance | reset |
| high resistance | high resistance | reset |

Regardless of the sequence of state transitions, the method of programming the memory element to the low resistance state as disclosed by the present invention ensures that two consecutive set pulses will not be applied to the volume of memory material. This ensures that excessive crystallization of the memory material does not occur as data is written to and/or erased from the memory element. Hence, the problem of delamination will be avoided.

It is noted that U.S. Pat. No. 4,389,713 discloses a dual pulse method for writing amorphous memory devices. In contrast to the present invention, the dual pulse method disclosed by the '713 Patent is a first pulse which switches the memory device from the high resistance state to the low resistance state and a second pulse, following the first pulse, which is sufficient to drive a portion of the memory material to its liquid state. This is distinct from the method described by the present invention.

Generally, in the programming method described above, the energy may be of any form including electrical energy, particle beam energy, thermal energy, electromagnetic energy, acoustical energy, and pressure energy. Preferably, the energy applied to the memory material is electrical energy. More preferably, the electrical energy is applied in the form of electrical current pulses (i.e., electrical pulses where the current is controlled). Hence, the first and second pulses of energy described above as well as the set and reset pulses are all preferably current pulses. Alternately, the electrical energy may be applied in the form of voltage pulses (i.e., electrical pulses where the voltage is controlled).

Also disclosed herein is a second method of programming the memory element which, like the previous method, ensures that two or more consecutive set pulses will not be applied to the memory element when writing data to and/or erasing data from the memory element. The second method of programming the memory element comprises the steps of reading the present state of the memory element; determining whether the present state is equal to the desired state; and if not, programming the memory element to the desired state.

The first step of this programming method is that of reading the present resistance state of the memory element. The may be done by applying a "read" pulse of energy to the volume of memory material. Generally, the energy of the read pulse may be of any form. Examples of forms of energy include electrical energy, particle beam energy, thermal energy, electromagnetic energy, acoustical energy, and pressure energy. Preferably, the energy is in the form of electrical energy. More preferably, the read pulse is preferably applied as a voltage pulse (i.e., the voltage of the electrical signal is controlled). Preferably, the read voltage pulse has an amplitude which is sufficient to read the resistance of the memory element but insufficient to program the memory element from one resistance state to a different resistance state.

The read voltage pulse may be applied across the memory material and the current through the memory material may then be used to determine the resistance state of the memory element. If the memory element is in its high resistance state, then the current through the memory material is low. Alternately, if the memory element is in its low resistance state, then the current through the memory material is high. The present resistance state may be stored in a register.

The next step of the programming method is to determine whether or not the present resistance state of the memory element is equal to the "desired" state. The desired state is the next resistance state to which the memory element is to be programmed. The determining step may be accomplished by comparing the resistance value of the present resistance state to that of the desired state. If the present resistance state of the memory element is equal to the desired state, then nothing further needs to be done (no programming pulses are applied to the volume of memory material). However, if the present resistance state of the memory element is not equal to that of the desired state, then programming pulses are applied to the memory element in order to transform the memory element from the present resistance state to the desired state.

It is noted that when using this second method of programming, programming pulses (for example, set or reset programming pulses) are applied to the memory material only when the state of the memory element needs to be changed. In particular, programming pulses are applied only when the state of the memory element needs to be changed from its high resistance to its low resistance state, or from its low resistance to its high resistance state.

When using this method of programming, the memory element may be programmed from its high resistance state to its low resistance state by applying a single set pulse to the volume of memory material. Also, the memory element may be programmed from its low resistance state to its high resistance state by applying a single reset pulse to the volume of memory material.

This method of programming ensures that two or more consecutive set pulses will not be applied to the memory material.

This ensures that excessive crystallization of the memory material does not occur when the memory element is programmed.

The phase-change memory material is preferably formed from a plurality of constituent atomic elements. Preferably, the phase-change material includes one or more elements selected from the group consisting of Te, Se, Ge, Sb, Bi, Pb, Sn, As, S, Si, P, O and mixtures or alloys thereof. The phase-change material preferably includes at least one chalcogen element. Preferably, the at least one chalcogen element is selected from the group consisting of Te, Se and mixtures or alloys thereof. The at least one chalcogen element may be a mixture of Te and Se.

An example of a composition providing improved electrical switching performance characteristics is a composition where the average concentration of Te in the as deposited materials is preferably less than about 70%, and more preferably between about 40% and about 60%. The concentration of Ge in the material is preferably greater than about 5%, more preferably between about 8% and about 50%, and most preferably between about 10% and about 44%. The remainder of the principal constituent elements is Sb. The percentages given are atomic percentages which preferably total 100% of the atoms of the constituent elements. Thus, this composition may be characterized as $Te_aGe_bSb_{100-(a+b)}$. These ternary Te—Ge—Sb alloys are useful starting materials for the development of additional phase-change materials having even better electrical characteristics.

The phase-change material may include at least one transition metal element. The term "transition metal" as used herein includes elements 21 to 30, 39 to 48, 57 and 72 to 80. Preferably, the transition metal element is selected from the group consisting of Cr, Fe, Ni, Nb, Pd, Pt and mixtures or alloys thereof. Most preferably the transition metal is Ni. Specific examples of such multi-element systems are set forth hereinafter with respect to the Te:Ge:Sb system with or without Ni and/or Se. The phase-change materials which include transition metals are elementally modified forms of the phase-change materials in the Te—Ge—Sb ternary system. That is, the elementally modified phase-change materials constitute modified forms of the Te—Ge—Sb phase-change alloys. This elemental modification is achieved by the incorporation of transition metals into the basic Te—Ge—Sb ternary system, with or without an additional chalcogen element, such as Se.

An example of an elementally modified phase-change material is a phase-change material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is preferably between about 90% and about 99.99%. The transition metal preferably include Cr, Fe, Ni, Nb, Pd, Pt and mixtures or alloys thereof.

Another example of an elementally modified phase-change material is a phase-change material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is preferably between about 90% and 99.5% and d is preferably between about 0.01% and 10%. The transition metal preferably includes Cr, Fe, Ni, Pd, Pt, Nb and mixtures or alloys thereof.

The memory element includes means for applying the energy to the volume of memory material. When the energy is electrical energy, the memory element may include electrical contacts for supplying the voltage or current to the volume of memory material. The shape of the contacts as well as their positioning relative to the volume of memory material may be varied to form different device structures. As an example, the electrical contacts may include first and second contacts positioned adjacent to the memory material.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. A method of programming an electrically programmable, phase-change memory element to a low resistance state, said memory element including a volume of phase-change memory material having at least said low resistance state and a detectably distinct high resistance state, said method comprising the steps of:

applying a first pulse of energy to said memory material, said first pulse sufficient to transform said memory material from said low resistance state to said high resistance state; and applying a second pulse of energy to said memory material following said first pulse, said second pulse sufficient to transform said memory material from said high resistance state to said low resistance state.

2. The method of claim 1, wherein the energy of said first pulse and said second pulse is electrical energy.

3. The method of claim 1, wherein said first pulse and said second pulse are current pulses.

4. The method of claim 1, wherein the duration of said first pulse is less than the duration of said second pulse.

5. The method of claim 1, wherein the amplitude of said first pulse is greater than the amplitude of said second pulse.

6. The method of claim 1, wherein said phase-change material comprises at least one chalcogen element.

7. A method of setting an electrically programmable, phase-change memory element having at least a low resistance state and a detectably distinct high resistance state, said method comprising the steps of:

applying a first pulse of energy to said memory material, said first pulse sufficient to transform said memory material from said low resistance state to said high resistance state; and applying a second pulse of energy to said memory material following said first pulse, said second pulse sufficient to transform said memory material from said high resistance state to said low resistance state.

8. The method of claim 7, wherein the energy of said first pulse and said second pulse is electrical energy.

9. The method of claim 7, wherein said first pulse and said second pulse are current pulses.

10. The method of claim 7, wherein the duration of said first pulse is less than the duration of said second pulse.

11. The method of claim 7, wherein the amplitude of said first pulse is greater than the amplitude of said second pulse.

12. The method of claim 7, wherein said phase-change material comprises at least one chalcogen element.

13. A method of programming an electrically programmable, phase-change memory element to a desired state, said memory element including a volume of phase-change memory material having at least a low resistance state and a detectably distinct high resistance state, said method comprising the steps of:

reading the present state of said memory element;

determining whether the present state is equal to said desired state; and if not, programming said memory element from the present state to said desired state.

14. The method of claim 13, wherein said reading step comprises the step of:

applying a read pulse of energy to said memory material; and determining the resistance of said memory material.

15. The method of claim 14, wherein said energy is electrical energy.

16. The method of claim 14, wherein said read pulse is a voltage pulse.

17. The method of claim 13, wherein said determining step comprises the step of comparing the present resistance of said memory material to said desired resistance state.

18. The method of claim 13, wherein said phase-change material includes a chalcogen element.

* * * * *